(12) United States Patent
Tsukamoto et al.

(10) Patent No.: US 6,804,423 B2
(45) Date of Patent: Oct. 12, 2004

(54) OPTICAL-ELECTRICAL WIRING BOARD, MOUNTED BOARD AND METHOD OF MANUFACTURING OPTICAL-ELECTRICAL WIRING BOARD

(75) Inventors: Takehito Tsukamoto, Tokyo (JP); Masakichi Yoshida, Tokyo (JP); Takao Minato, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 10/022,388

(22) Filed: Dec. 20, 2001

(65) Prior Publication Data

US 2002/0051599 A1 May 2, 2002

Related U.S. Application Data

(63) Continuation of application No. PCT/JP00/04174, filed on Jun. 26, 2000.

(30) Foreign Application Priority Data

Jun. 25, 1999 (JP) .............................. 11-179646

(51) Int. Cl.[7] ................................................ G02B 6/12
(52) U.S. Cl. .............................. 385/14; 385/35; 385/50
(58) Field of Search .............................. 361/760–764, 361/749–750, 795; 385/14, 35, 50, 131; 174/254–258

(56) References Cited

U.S. PATENT DOCUMENTS

| | | | |
|---|---|---|---|
| 5,125,054 A | | 6/1992 | Ackley et al. |
| 5,170,448 A | * | 12/1992 | Ackley et al. ................ 385/31 |
| 5,394,490 A | * | 2/1995 | Kato et al. ..................... 385/14 |
| 5,600,741 A | * | 2/1997 | Hauer et al. .................. 385/35 |
| 6,236,786 B1 | * | 5/2001 | Aoki et al. .................... 385/50 |
| 6,285,808 B1 | * | 9/2001 | Mehlhorn et al. ............ 385/14 |

FOREIGN PATENT DOCUMENTS

| | | |
|---|---|---|
| EP | 1 041 410 A1 | 10/2000 |
| JP | 61-500941 | 5/1986 |
| JP | 5-264833 | 10/1993 |
| JP | 9-281352 | 10/1997 |
| JP | 10-126018 | 5/1998 |
| JP | 11-248956 | 9/1999 |

OTHER PUBLICATIONS

Patent Abstract of Japan, Publication No. 2000298216, Publication Date Oct. 24, 2000.

* cited by examiner

*Primary Examiner*—David A. Zerneke
*Assistant Examiner*—Tuan Dinh (57) ABSTRACT

Disclosed is an optical-electrical wiring board, comprising an electrical wiring board having a through-hole formed therein and an optical wiring layer laminated on the board and including a core and a clad surrounding the core. The electrical wiring board includes an electrical wiring formed on one surface of the board and pads on which optical parts are mounted. The pads are electrically connected to the electrical wiring and arranged on one surface of the electrical wiring board in the vicinity of a through-hole. The core includes a horizontal waveguide for propagating the light beam in a horizontal direction along the electrical wiring board and a vertical waveguide having a part arranged inside the through-hole and crossing the horizontal waveguide. The vertical waveguide propagates the light beam in a direction perpendicular to the electrical wiring board.

7 Claims, 6 Drawing Sheets

OPTICAL-ELECTRICAL WIRING BOARD, MOUNTED BOARD AND METHOD OF MANUFACTURING OPTICAL-ELECTRICAL WIRING BOARD

CROSS-REFERENCE TO RELATED APPLICATIONS

This is a Continuation Application of PCT Application Ser. No. PCT/JP00/04174, filed Jun. 26, 2000, which was not published under PCT Article 21(2) in English.

This application is based upon and claims the benefit of priority from the prior Japanese Patent Application No. 11-179646, filed Jun. 25, 1999, the entire contents of which are incorporated herein by reference.

BACKGROUND OF THE INVENTION

1. Field of the Invention

In recent years, the clock frequency of a CPU tends to be more and more increased in an attempt to manufacture an electronic computer capable of achieving an arithmetic processing more rapidly. Nowadays, a CPU having a clock frequency of 1 GHz order has come to be put on the market.

2. Description of the Related Art

In general, the signal speed between elements outside an electric element is increased with increases in the clock frequency inside the electric element. Therefore, a portion in which a high frequency current flows is present in the electric wiring made of copper on the printed circuit board included in an electronic computer. As a result, a malfunction is brought about by the noise generation. Also, an electromagnetic wave is generated so as to give an adverse effect to the surrounding environment.

In order to overcome the problems described above, an optical wiring utilizing an optical fiber or an optical waveguide is substituted for a part of the electric wiring made of copper on the printed circuit board so as to utilize the optical signal in place of the electric signal. The optical signal is utilized because, in the case of the optical signal, it is possible to suppress the generation of the noise and the electromagnetic wave.

However, an electric wiring is formed on the electric wiring board. What should be noted is that the electric wiring makes the surface of the electric wiring board highly rough. The optical wiring tends to be greatly affected by the surface roughness, with the result that the propagation loss of the optical signal is considered to be increased.

On the other hand, it is desirable for the optical-electrical wiring board, in which an optical wiring is partly substituted for the electrical wiring so as to propagate both the electric signal and the optical signal, to be mounted at a high density or to be miniaturized in view of the object of the use of the optical-electrical wiring board.

BRIEF SUMMARY OF THE INVENTION

An object of the present invention, which has been achieved in view of the situation described above, is to provide an optical-electrical wiring board and a mounted board capable of a high density mounting and miniaturization and permitting propagation of an optical signal with a high efficiency, and a method of manufacturing an optical-electrical wiring board.

According to a first aspect of the present invention, there is provided an optical-electrical wiring board, comprising an electrical wiring board having a through-hole formed therein, and an optical wiring layer laminated on the electrical wiring board and including a core through which the light is propagated and a clad surrounding the core, characterized in that the electrical wiring board includes an electrical wiring formed on a first surface, and mounting means for mounting an optical part, the mounting means being electrically connected to the electric wiring and mounted in the vicinity of the through-hole of the first surface, and the core includes a first waveguide for propagating the light in a first direction along the electrical wiring board and a second waveguide for propagating the light in a second direction perpendicular to the electrical wiring board, the second waveguide crossing the first waveguide and a part of the second waveguide being arranged within the through-hole.

According to a second aspect of the present invention, there is provided an optical-electrical wiring board according to the first aspect of the present invention, characterized in that the optical-electrical wiring board further comprises a mirror arranged in the crossing point between the first waveguide and the second waveguide and serving to reflect the light propagated through one waveguide toward the other waveguide.

According to a third aspect of the present invention, there is provided an optical-electrical wiring board according to the second aspect of the present invention, characterized in that one end of the second waveguide is exposed to the first surface.

According to a fourth aspect of the present invention, there is provided an optical-electrical wiring board according to the second aspect of the present invention, characterized in that the optical-electrical wiring board further comprises a light-collecting lens mounted on the first surface.

According to a fifth aspect of the present invention, there is provided an optical-electrical wiring board according to the second aspect of the present invention, characterized in that the second waveguide is tapered from the first surface toward a second surface opposite to the first surface or from the second surface toward the first surface.

According to a sixth aspect of the present invention, there is provided an optical-electrical wiring board, comprising an electrical wiring board having a through-hole formed therein and an optical wiring layer laminated on the electrical wiring board, characterized in that the electrical wiring board includes an electrical wiring formed on the first surface, and mounting means for mounting an optical part, the mounting means being electrically connected to the electrical wiring and arranged in the vicinity of the through-hole of the first surface, and the optical wiring layer includes a core for propagating the light in a direction extending along the electrical wiring board, and a clad surrounding the core.

According to a seventh aspect of the present invention, there is provided an optical-electrical wiring board according to the sixth aspect of the present invention, characterized in that the optical-electrical wiring board further comprises a mirror for reflecting the light propagated through the core.

According to an eighth aspect of the present invention, there is provided an optical-electrical wiring board according to the first or sixth aspect of the present invention, characterized in that the optical-electrical wiring board further comprises mounting means for mounting an electrical part arranged on the first surface, the mounting means being electrically connected to the electrical wiring.

According to a ninth aspect of the present invention, there is provided an optical-electrical wiring board according to the second or seventh aspect of the present invention, characterized in that the electrical wiring comprises a plurality of layers, and connecting means for electrically connecting the plural layers of the electrical wiring is arranged inside the through-hole.

According to a tenth aspect of the present invention, there is provided an optical-electrical wiring board according to the second or seventh aspect of the present invention, characterized in that the mounting means is arranged such that, when a light-emitting element or a light-receiving element is mounted on the mounting means, the light-emitting surface of the light-emitting element or the light-receiving surface of the light-receiving element is arranged on the axis of the second waveguide.

According to an eleventh aspect of the present invention, there is provided a mounted board prepared by mounting an electric part to the optical-electrical wiring board according to the first or sixth aspect of the present invention.

According to a twelfth aspect of the present invention, there is provided a mounted board prepared by mounting an electric part to the optical-electrical wiring board according to the second or seventh aspect of the present invention.

According to a thirteenth aspect of the present invention, there is provided a method of manufacturing an optical-electrical wiring board, comprising the step of forming a through-hole in an electrical wiring board having an electrical wiring formed on a first surface; the step of bonding an optical wiring layer including a core and a clad surrounding the core to a second surface opposite to the first surface of the electrical wiring board; and the step of forming a mirror in the optical wiring layer, the mirror serving to reflect the light propagated through the core toward the through-hole or to reflect the light passing through the through-hole so as to be incident on the mirror toward the core.

According to a fourteenth aspect of the present invention, there is provided a method of manufacturing an optical-electrical wiring board, comprising the step of forming a first through-hole in an electrical wiring board having an electrical wiring formed on a first surface; the step of filling the first through-hole with a clad; the step of bonding an optical wiring layer including a first core and a clad surrounding the first core to a second surface opposite to the first surface of the electrical wiring board; the step of forming a second through-hole having an inner diameter smaller than the inner diameter of the first through-hole and extending through the electrical wiring board, the first core, and the clad surrounding the first core in a central portion of the first through-hole; the step of filling the second through-hole with a second core so as to form a waveguide extending in a direction perpendicular to the electrical wiring board; and the step of forming a mirror reflecting the light propagated through one core toward the other core in a portion where the first core and the second core are allowed to cross each other.

According to a fifteenth aspect of the present invention, there is provided a method of manufacturing an optical-electrical wiring board, comprising the step of forming a first through-hole in an electrical wiring board having an electrical wiring formed on a first surface; the step of filling the first through-hole with a clad; the step of forming an optical wiring layer including a first core and a clad surrounding the first core on a second surface opposite to the first surface of the electrical wiring board; the step of forming a second through-hole having an inner diameter smaller than the inner diameter of the first through-hole and extending through the electrical wiring board, the first core and the first clad surrounding the first core in a central portion of the first through-hole; the step of filling the second through-hole with a second core so as to form a waveguide extending in a direction perpendicular to the electrical wiring board; and the step of forming a mirror reflecting the light propagated through one core toward the other core in a portion where the first core and the second core are allowed to cross each other.

Further, according to a sixteenth aspect of the present invention, there is provided a method of manufacturing an optical-electrical wiring board according to the fourteenth or fifteenth aspect of the present invention, characterized in that the method further comprises the step of forming a light-collecting lens in one edge of the second core on the side of the first surface.

According to the particular construction defined above, it is possible to realize an optical-electrical wiring board and a mounted board capable of a high density mounting or miniaturization and permitting an optical signal to be propagated at a high efficiency and to realize a method of manufacturing an optical-electrical wiring board.

Various stages of the inventions are included in the embodiments of the present invention, and it is possible to extract various inventions by a suitable combination of a plurality of constituents disclosed herein. For example, where the invention is extracted by omitting several constituents from all the constituents disclosed in the embodiment of the present invention, the omitted portion is supplemented by the known technology in working the extracted invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

The best mode of working the present invention will now be described with reference to the accompanying drawings. In the following description, the constituents of the invention having substantially the same function and construction are denoted by the same reference numerals, and an overlapping description is made in only the required portion.

<First Embodiment>

1-1: Optical-Electrical Wiring Board

An important point of the optical-electrical wiring board according to a first embodiment of the present invention resides in the technical idea that a board provided with an electrical wiring and having an optical part or an electrical part mounted thereon is laminated on an optical wiring layer having an optical waveguide for propagating the light in the direction along a layer and another optical waveguide for propagating the light in a direction perpendicular to said layer.

Figure 1:
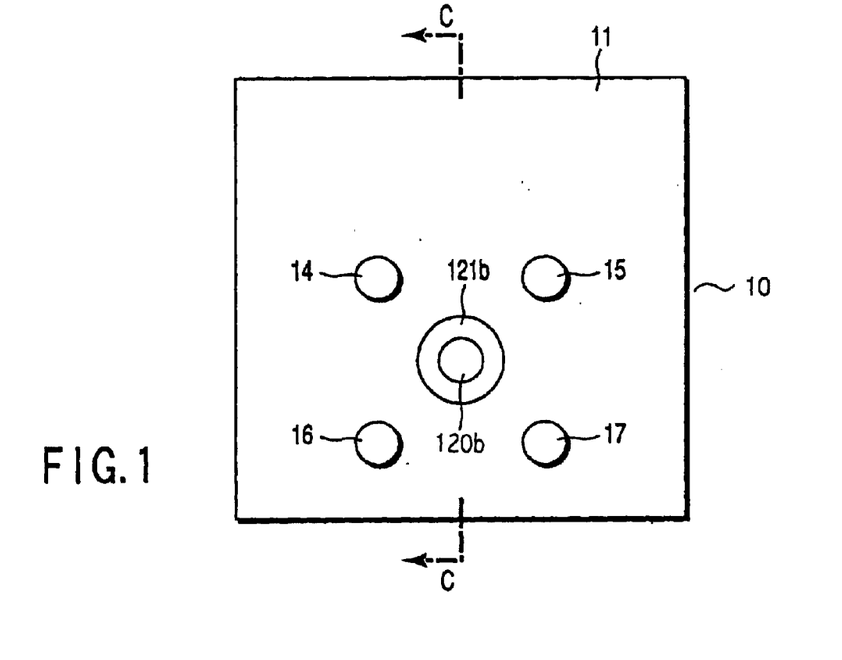
FIG. 1 shows an optical-electrical wiring board 10 as viewed from the mounted side of an optical part.

FIG. 1 shows an optical-electrical wiring board 10 according to a first embodiment of the present invention as viewed from the mounted side of an optical part. On the other hand.

Figure 2:
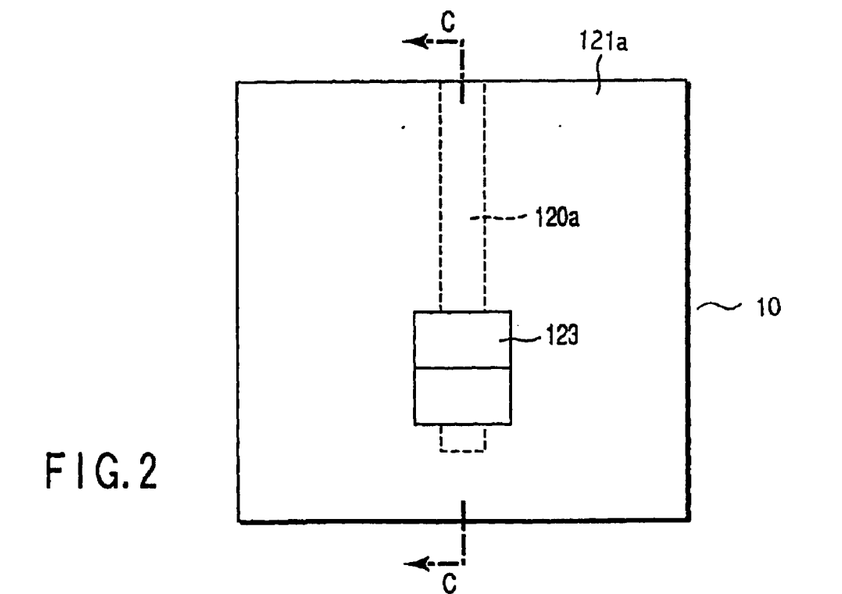
FIG. 2 shows the optical-electrical wiring board 10 as viewed from the side opposite to the mounted side of an optical part.

FIG. 2 shows the optical-electrical wiring board 10 as viewed from the side opposite the mounted side of the optical part.

Figure 3:
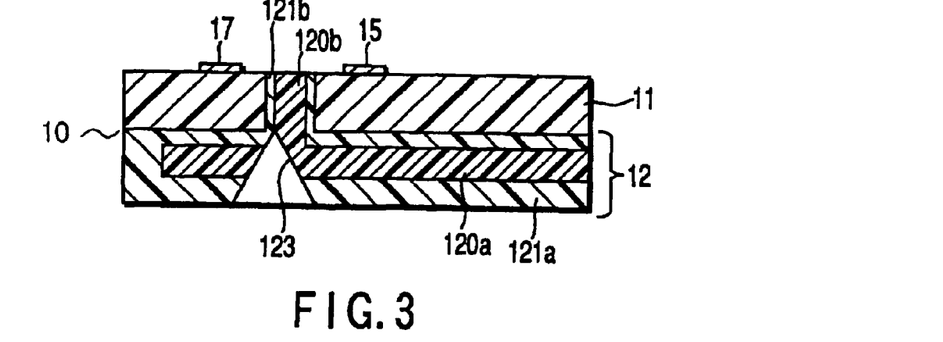
FIG. 3 is a cross sectional view along the line C—C (core pattern) shown in FIG. 1 or 2.

FIG. 3 is a cross sectional view along the line C—C shown in FIG. 1 or 2. As schematically shown in FIG. 3, the optical-electrical wiring board 10 comprises an optical wiring layer 12 and an electrical wiring board 11 laminated on the optical wiring layer 12.

The optical-electrical wiring board 10 and the electrical wiring board 11 forms an electrical wiring system and the optical wiring layer 12 forms an optical wiring system. Also, as described herein later, an optical part such as a laser diode or a photodiode and an electrical part such as an IC are mounted on the electrical wiring board 11 of the optical-electrical wiring board 10 (see FIGS. 9, 10 and 11). The construction of the electrical wiring board 11 and the optical wiring layer 12 will now be described in detail in the order mentioned with reference to FIGS. 1, 2 and 3.

The electrical wiring board 11 is a board having an electrical wiring (not shown) formed on one surface. It is possible for the electrical wiring board 11 to be an insulating board of a single layer structure or a multi-layered wiring board in which an electrical wiring and an insulating layer are alternately laminated one upon the other. Also, it is possible for the electrical wiring board 11 to be formed of an insulating board prepared by impregnating a glass cloth with a resin, to be formed of a polyimide film or to be formed of a ceramic board.

Pads 14, 15, 16, 17 for mounting optical parts and a pad (not shown) for mounting an electrical part are formed on that surface of the electrical wiring board on which an electric wiring is formed. Each of these pads is electrically connected to the electric wiring and serves to electrically connect the electric wiring to the optical part or the electric part formed on the electric wiring board 11. The number of pads is determined by the number of terminals of the optical parts, etc. and the number of parts mounted on the electric wiring board. The number of parts need not be limited to four as shown in FIG. 1 and may be optional. Also, the clearance between the adjacent pads may be optional so as to conform with the clearance between the adjacent terminals of the optical parts, etc., mounted on the electrical wiring board 11. Further, it is possible for the pad to be shaped variously. In other words, the shape of the pad is determined based on the shape of the connecting terminal of the optical part mounted on the electric wiring board 11. Needless to say, the pad need not be shaped circular as shown in FIG. 1 and may be shaped variously. In general, it is considered reasonable to understand that the pad is shaped to conform with the shape of the solder ball or the metal lead used for the connection to the optical part.

The board 11 is provided with a hole for forming a vertical waveguide 120b referred to herein later and with a hole for forming a vertical clad 121b referred to herein later. Also, where the board 11 includes an electric wiring formed of a plurality of layers, it is possible to arrange a conductive layer between the adjacent layers of the electric wiring for improving the electrical conductivity.

The optical wiring layer 12 is laminated on the other surface of the electric wiring board 11, and includes a core 120 used as an optical waveguide for propagating the optical signal, a clad 121 having a refractive index lower than that of the core 120 and having the core 120 buried therein, and a mirror 123 for reflecting the light propagated within the core 120.

The core 120 includes a horizontal waveguide 120a for propagating the light along the electric wiring board 11 and a vertical waveguide 120b for propagating the light in the laminating direction of the electric wiring board 11 and the optical wiring layer 12, i.e., in a direction perpendicular to the electric wiring board 11. How to form these two waveguides will be described herein later. For forming the core 120, it is possible to select a resin having a refractive index suitable for the wavelength of the light to be guided. For example, it is possible to use a fluorine-containing polyimide resin or a fluorine-containing epoxy resin for forming the core 120.

The clad 121 includes a horizontal clad 121a, in which is buried the horizontal waveguide 120a of the core 120, and a vertical clad 121b, in which is buried the vertical waveguide 120b of the core 120. As described previously, the clad 121 has a refractive index lower than that of the core 120. It follows that the light incident on a part of the core 120 is repeatedly reflected at the boundary plane between the core 120 and the clad 121 so as to be propagated within the core 120. It is possible to use, for example, a fluorine-containing polyimide series resin or a fluorine-containing epoxy series resin for forming the clad 121.

Incidentally, the angle θ made between the horizontal clad 121a and the vertical clad 121b (i.e., the angle made between the horizontal waveguide 120a and the vertical waveguide 120b) is determined in accordance with the desired optical propagating route. In the first embodiment and second embodiment described herein later, the angle θ noted above is set at 90° as an example. Also, one end of each of the vertical waveguide 120b and the vertical clad 121b is exposed to that surface of the board 11 on which is mounted the optical part, etc., as shown in FIG. 1.

The mirror 123 is formed at the portion where the horizontal waveguide 120a crosses the vertical waveguide 120b and acts as a reflecting mirror for reflecting the light incident on one waveguide toward the other waveguide. It follows that the angle of the mirror 123 is dependent on the angle made between the horizontal waveguide 120a and the vertical reflecting mirror 120b and is formed at an angle suitable for the light reflection between the horizontal waveguide 120a and the vertical waveguide 120b. For example, in the optical-electrical wiring board 10 shown in FIG. 3, the horizontal waveguide 120a and the vertical waveguide 120b are formed to make an angle of 90° and, thus, the mirror 123 is formed to make an angle of 45° with the axis of each of these waveguides.

The mirror 123 is formed by a dicing process having a blade of 90° or by an oblique etching achieved by a dry etching such as RIE. The specific forming method of the mirror 123 will be described herein later. It should be noted, however, that, since the mirror 123 is formed on the basis of a reference position in which is arranged an optical wiring, the positional accuracy with the core of the optical wiring is rendered very high.

Incidentally, the interface of the mirror 123, i.e., the surface on the opposite side of the core 120, is brought into contact with a resin having a refractive index lower than that of the core 120 or with the air. Also, it is possible to form a metal thin film on the interface noted above.

The alignment of the optical axis between the optical part mounted on the optical-electrical wiring board 10 and the optical-electrical wiring board 10 will now be described.

An optical part or an electrical part is mounted on the optical-electrical wiring board 10 shown in FIG. 3. For example, FIG. 9 shows a mounted board in which a light-receiving element 50 is mounted on the optical-electrical wiring board 10.

Figures 8A, 8B, 8C, 9, 10:
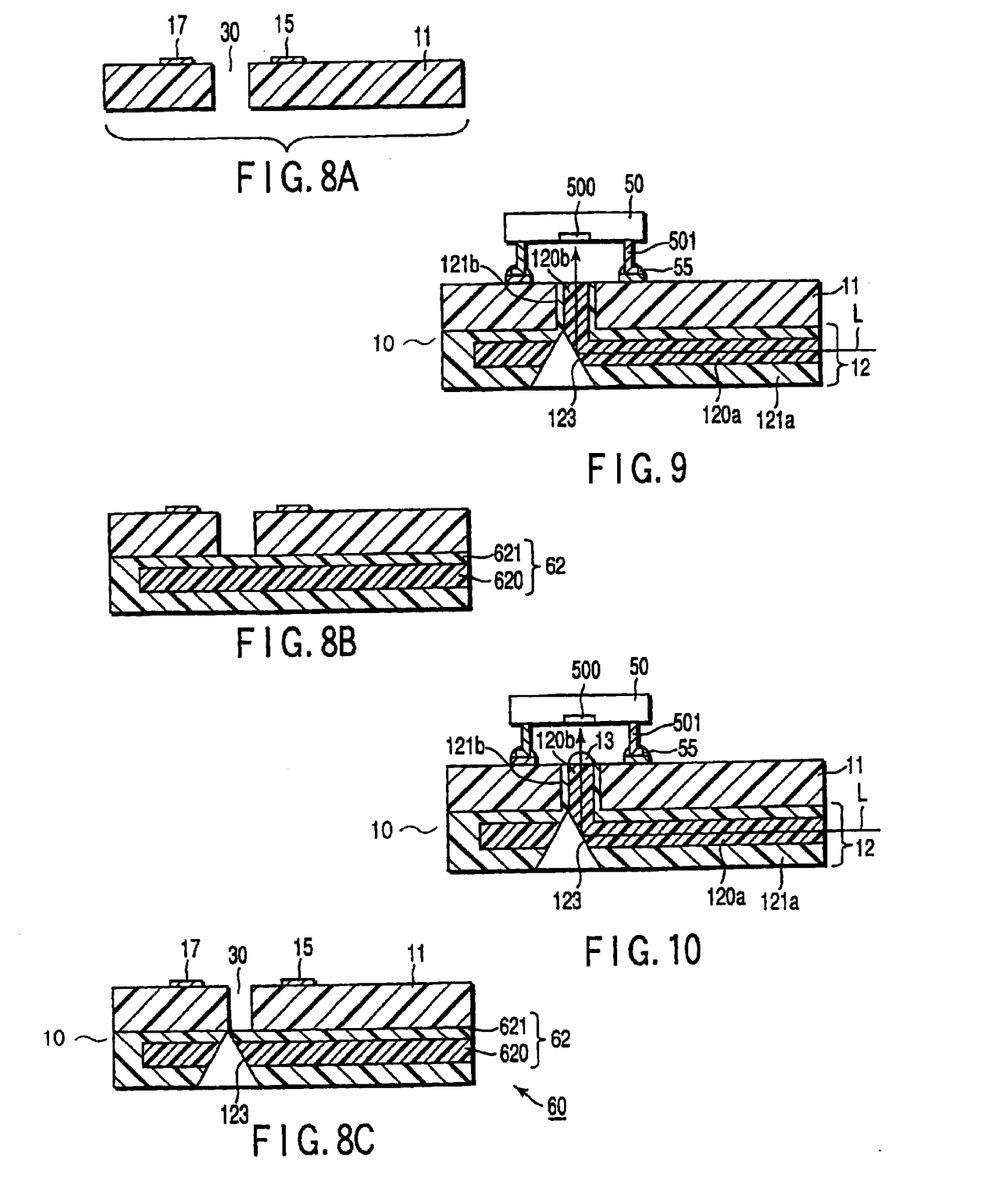
FIGS. 8A, 8B and 8C are cross sectional views collectively showing the steps of a method of manufacturing the optical-electrical wiring board 10.
FIG. 9 is a cross sectional view showing a mounted board in which a lead 501 of a light-receiving element 50 is soldered to the optical-electrical wiring board 10.
FIG. 10 is a cross sectional view showing a mounted board in which a lead 501 of a light-receiving element 50 is soldered to the optical-electrical wiring board 10 provided with a light collecting lens 13.

As shown in FIG. 9, the light beam L incident on one end of the horizontal waveguide 120a is reflected by the mirror 123 into the vertical waveguide 120b. Then, the light beam L propagated through the vertical waveguide 120b is incident on the light-receiving surface of the light-receiving element 50. In the mounted board in which an optical information is exchanged between the optical part and the optical-electrical wiring board 10 by the particular construction described above, it is important to align the optical axis between the optical part and the optical-electrical wiring board.

In order to facilitate the alignment of the optical axis between the optical part and the optical-electrical wiring board 10, it may be desirable to employ, for example, a modification of the construction described in the following.

Figure 4:
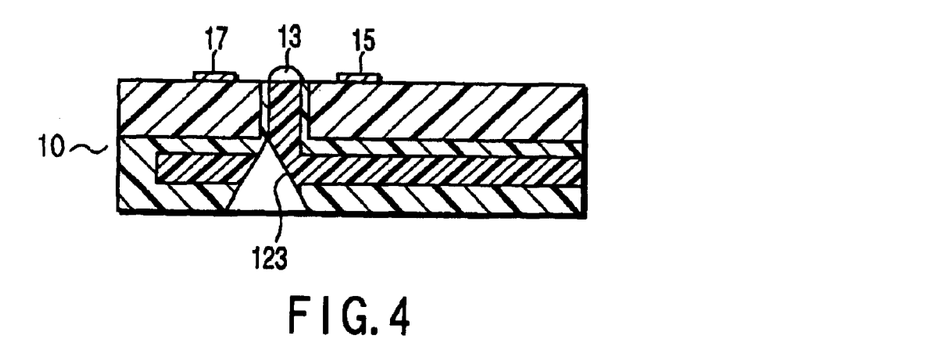
FIG. 4 exemplifies the optical-electrical wiring board 10 that facilitates the alignment of the optical axis with a light-receiving element that is mounted.

FIG. 4 shows an example that is considered to facilitate the alignment of the optical axis between the optical-electrical wiring board 10 and the light-receiving element mounted on the optical-electrical wiring board 10. This example is featured in that a light collecting lens 13 is mounted on one end of the vertical waveguide 120b on the side of the mounting surface of the optical part. In the optical-electrical wiring board 10 shown in FIG. 4, the light propagated through the vertical waveguide 120b is collected by the lens 13 (see FIG. 10) so as to make it possible to achieve the alignment of the optical axis with a high accuracy.

On the other hand, it is possible to expect the effect of the optical axis alignment also in the case where a light-emitting element is mounted on the optical-electrical wiring board 10 shown in FIG. 4. To be more specific, the laser beam emitted from the light-emitting element is collected by the light collecting lens 13 on the optical axis of the vertical waveguide 120b. It follows that the alignment of the optical axis can be achieved with a high accuracy even in the case where, for example, the laser beam deviates from the optical axis of the vertical waveguide 120b incident on the light collecting lens 13.

Figure 5:
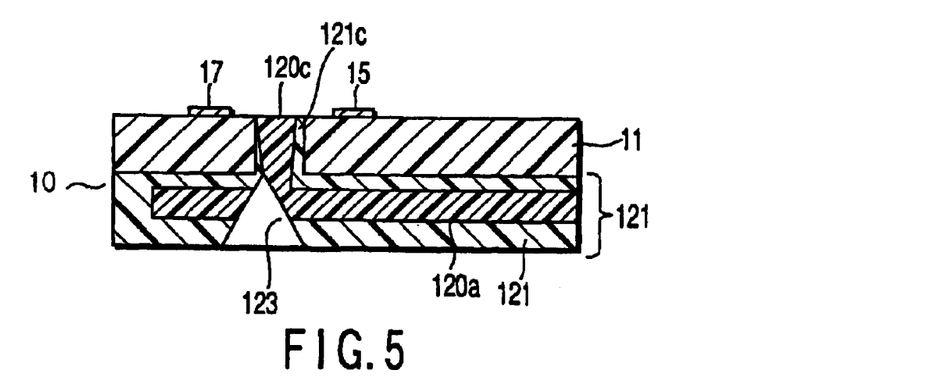
FIG. 5 exemplifies the optical-electrical wiring board 10 that facilitates the alignment of the optical axis with a light-receiving element that is mounted.

FIG. 5 shows an example that permits facilitating the alignment of the optical axis between the optical-electrical wiring board 10 and a light-emitting element mounted on the optical-electrical wiring board 10. The optical-electrical wiring board 10 shown in FIG. 5 is featured in that the vertical waveguide 120c is tapered such that the diameter of the vertical waveguide 120c is gradually diminished from the mounting surface of the optical part toward the mirror 123. In the case of the tapered vertical waveguide 120c of the particular shape, the light propagated through the waveguide 120c is collected while running from the mounting surface of the optical part toward the mirror 123 (see FIG. 11) so as to make it possible to achieve the alignment of the optical axis with a higher accuracy.

(Manufacturing Method 1 of Optical-Electrical Wiring Board)

A first manufacturing method of the optical-electrical wiring board 10 according to the first embodiment of the present invention will now be described with reference to FIGS. 6A to 6H, with the emphasis placed on the core 120 (i.e., the horizontal waveguide 120a and the vertical waveguide 120b) and the clad 121 (i.e., the horizontal clad 121a and the vertical clad 121b).

FIGS. 6A to 6H are cross sectional views showing successively the steps of a manufacturing method of the optical-electrical wiring board 10.

Figure 6A:
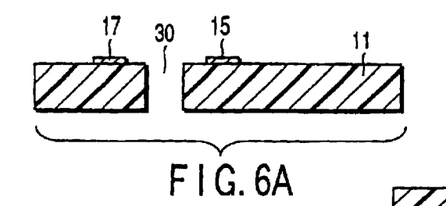
FIGS. 6A to 6H are cross sectional views collectively showing the steps of a method of manufacturing the optical-electrical wiring board 10.

In the first step, as shown in FIG. 6A, a through-hole 30 having a diameter of 100 µm is formed by a laser beam irradiation in the electric wiring board 11 formed of a polyimide film having a thickness of 125 µm. As shown in the drawing, an electric wiring and pads 14, 15, 16, 17 (pads 14, 16 being not shown in FIG. 1) are formed on the electric wiring board 11. Incidentally, FIG. 6A shows that the electric wiring board 11 is divided by the through-hole 30. However, this is simply intended to facilitate the description. Needless to say, the through-hole 30 is simply a hole formed to extend through the electrical wiring board 11 as shown in, for example, FIG. 1. This is also the case with each of FIGS. 7A and 8A referred to herein later.

Figure 6B:
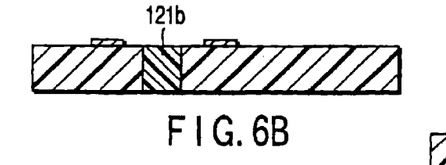
Figure 6C:
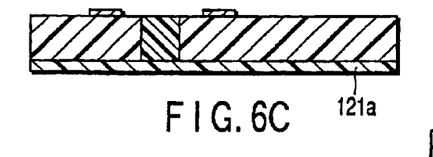

In the next step, the through-hole 30 made in the electrical wiring board 11 is filled with the vertical clad 121b made of a fluorine-containing epoxy resin adjusted to have a refractive index of, for example, 1.52, followed by curing the vertical clad 121b at 200° C., as shown in FIG. 6B. Then, that surface of the electrical wiring board 11 on which the pads are not formed is coated with a fluorine-containing epoxy resin adjusted to have a refractive index of 1.52, as shown in FIG. 6C, followed by curing the coated fluorine-base epoxy resin at 200° C. so as to form a part of the horizontal clad 121a having a thickness of, for example, 20 µm.

Figure 6D:
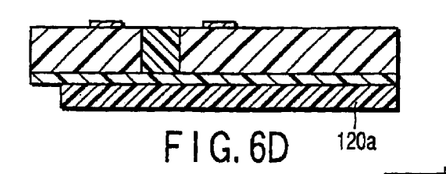

Then, the surface of a part of the horizontal clad 121a thus formed is coated with a fluorine-containing epoxy resin adjusted to have a refractive index of 1.53, followed by curing the coated fluorine-containing epoxy resin layer at 200° C., thereby forming the horizontal waveguide 120a having a thickness of 8 µm by the ordinary method of a dry etching, as shown in FIG. 6D. In this case, the horizontal waveguide 120a has a width of, for example, 8 µm.

Figure 6E:
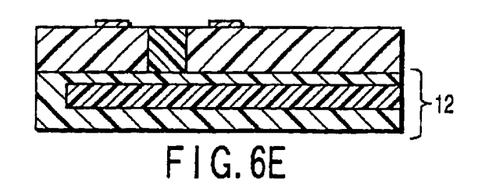

In the next step, the horizontal waveguide 120a is coated with a fluorine-containing epoxy resin adjusted to have a refractive index of 1.52, as shown in FIG. 6E. Then, the coated fluorine-containing epoxy resin is cured so as to set the thickness of the fluorine-containing epoxy resin layer at 20 μm, thereby forming the remaining part of the horizontal clad 121a. The optical wiring layer 12 is formed by the steps described above.

Figure 6F:
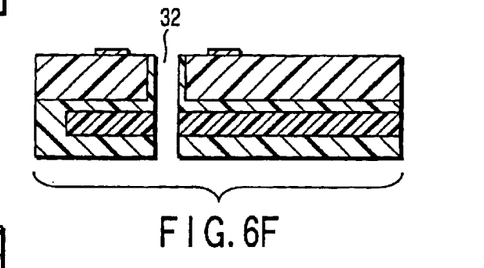

In the next step, a through-hole 32 having an inner diameter smaller than that of the through-hole 30 is formed in the central portion of the through-hole 30 filled with the vertical clad 121b, as shown in FIG. 6F. As a result, the side surface of the through-hole 32 is covered with the vertical clad 121b.

Incidentally, in the case of forming the tapered optical waveguide 121c shown in FIG. 5, the diameter of the laser beam is diminished in the optical system in the laser processing step shown in FIG. 6F, and the laser beam having the diminished diameter is applied from the mounting side of the optical part or the like so as to make it possible to form the through-hole 32 conforming with the shape of the vertical clad 121c shown in FIG. 5.

Figure 6G:
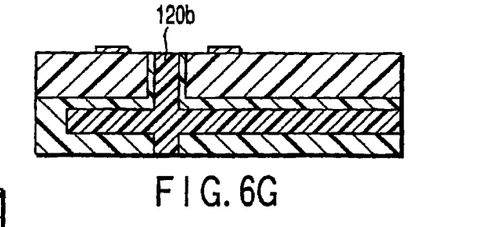

In the next step, the through-hole 32 of the electrical wiring board 11 is filled with a fluorine-containing epoxy resin, which is equal to the material of the horizontal waveguide 120a, followed by curing the fluorine-containing epoxy resin at 200° C. so as to form the vertical waveguide 120b.

Figure 6H:
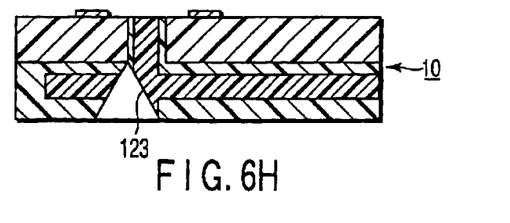

Then, the mirror 123 having a surface inclined by 45° relative to the surface of the electrical wiring board 11 is formed by the dicing process with a blade having an angle of 90° or by an oblique etching with a RIE at the portion in which the horizontal waveguide 120a crosses the vertical waveguide 120b, as shown in FIG. 6H. It is possible for the mirror 123 to be a mirror having a metal reflecting film formed by a sputtering method or by a vapor deposition. The mirror 123 is formed by using as a reference an alignment mark (not shown) formed at the bonding surface between the electrical wiring board 11 and the optical wiring layer 12.

Incidentally, the lens 13 shown in FIG. 4 can be formed easily by forming a rectangular pattern of a photosensitive acrylic resin having a low Tg or a low melting point and having a refractive index equal to that of the vertical waveguide 120b on the exposed surface of an optical through-hole, followed by melting the rectangular pattern of the acrylic resin at 200° C.

(Manufacturing Method 2 of Optical-Electrical Wiring Board)

A second manufacturing method of the optical-electrical wiring board 10 according to the first embodiment of the present invention will now be described with reference to FIGS. 7A to 7F, with the emphasis placed on the core 120 and the clad 121 as in the first manufacturing method described above. The second manufacturing method widely differs from the first manufacturing method in that, in place of forming the optical wiring layer 12 directly on the electrical wiring board 11, the optical wiring layer 12 and the electrical wiring board 11, which are prepared separately, are bonded to each other in the second manufacturing method.

Figure 7A:
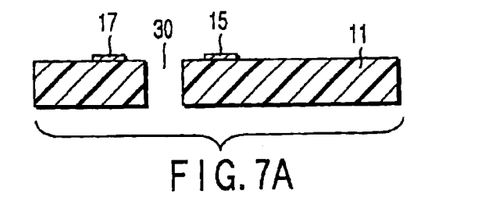
FIGS. 7A to 7F are cross sectional views collectively showing the steps of a method of manufacturing the optical-electrical wiring board 10.

FIGS. 7A to 7F are cross sectional views collectively showing successively the steps of a method of manufacturing the optical-electrical wiring board 10. In the second manufacturing method, a glass/polyimide multi-layered substrate having an electric wiring (not shown) and pads 14, 15, 16, 17 (pads 14 and 16 being not shown in the drawing) formed on the surface and provided with the through-hole 30 having a diameter of 300 μm as shown in FIG. 7A is used as the electrical wiring board 11.

Figure 7B:
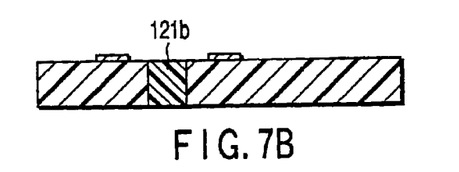

As shown in FIG. 7B, the through-hole 30 of the electrical wiring board 30 is filled with a fluorine-containing epoxy resin having the refractive index adjusted at 1.52, followed by curing the fluorine-containing epoxy resin at 200° C. so as to obtain the vertical clad 121b.

Figure 7C:
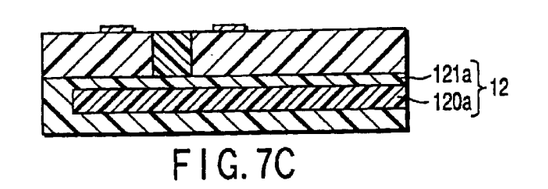

In the next step, the optical wiring layer 12 in the form of a film is bonded to the electrical wiring board 11 with an adhesive (not shown) interposed therebetween, as shown in FIG. 7C. The optical wiring layer 11 is formed in advance by the ordinary method on a silicon wafer prepared separately. Also, the core 120 included in the optical wiring layer 12 is formed of a fluorine-containing epoxy resin having a refractive index of 1.53. On the other hand, the clad 121 included in the optical wiring layer 12 is formed of a fluorine-containing resin having a refractive index of 1.52. A cross section of the core 120 has a size of, for example, 40 μm×40 μm. It should also be noted that the adhesive layer used for the bonding of the optical wiring layer 12 and the electrical wiring board 11 has a refractive index equal to that of the vertical clad 121b filling the through-hole 30.

Figure 7D:
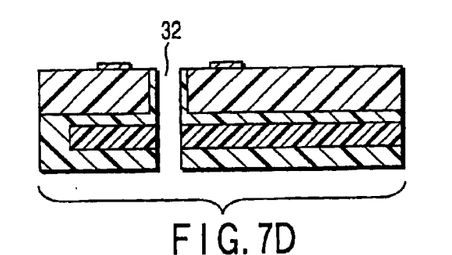

In the next step, as shown in FIG. 7D, the through-hole 32 having an inner diameter smaller than that of the through-hole 30 is formed by using an excimer laser in the central portion of the through-hole 30. As a result, the side surface of the through-hole 32 is covered with the vertical clad 121b.

Incidentally, in the case of forming the tapered optical waveguide 121c shown in FIG. 5, the diameter of the laser beam is diminished in the optical system in the laser processing step shown in FIG. 7D, and the laser beam having the diminished diameter is applied from the mounting side of the optical part or the like, as described previously in conjunction with the first manufacturing method, so as to make it possible to form the through-hole 32 conforming with the shape of the vertical clad 121c shown in FIG. 5.

Figure 7E:
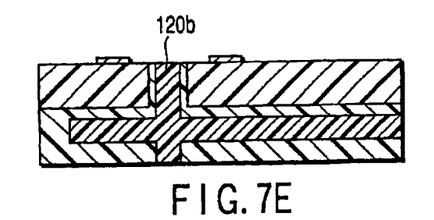
Figure 7F:
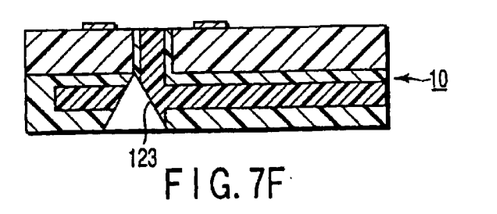

In the next step, the through-hole 32 of the electrical wiring board 11 is filled with a fluorine-containing epoxy resin, which is the same as the material of the horizontal waveguide 120a, followed by curing the fluorine-containing epoxy resin at 200° C. so as to form the vertical waveguide 120b. Then, the mirror 123 having a surface inclined by 45° relative to the surface of the electrical wiring board 11 is formed by the dicing process with a blade having an angle of 90° or by an oblique etching with a RIE at the portion in which the horizontal waveguide 120a crosses the vertical waveguide 120b, as shown in FIG. 7F. It is possible for the mirror 123 to be a mirror having a metal reflecting film formed by a sputtering method or by a vapor deposition. The mirror 123 is formed by using as a reference an alignment mark (not shown) formed on the electrical wiring board 11 as in the first manufacturing method.

Incidentally, the lens shown in FIG. 4 can be formed easily by forming a rectangular pattern of a photosensitive acrylic resin having a low Tg or a low melting point and having a refractive index equal to that of the vertical waveguide 120b on the exposed surface of an optical through-hole, followed by melting the rectangular pattern of the acrylic resin at 200° C.

(Manufacturing Method of Mounted Board)

A method of manufacturing a mounted board, in which an optical part, etc. is mounted on the optical-electrical wiring board 10, will now be described.

FIG. 9 shows a mounted board, in which a lead 501 of a light-receiving element is soldered to the optical-electrical wiring board. As shown in FIG. 9, the optical part and the electrical part are electrically connected to the optical-electrical wiring board 10 by the solder bonding between the pad and the metal lead 501 of each part that is performed by a solder 55. Also, where the optical part or the like does not have a metal lead, the electrical connection is achieved by a solder ball or the like.

FIG. 10 shows a mounted board, in which the lead 501 of a light-receiving element 50 is soldered to the optical-electrical wiring board 10 provided with a light-collecting lens 13.

As shown in FIG. 10, the laser beam propagated through the horizontal waveguide 120a of the optical wiring layer 12 is reflected by the mirror 123. Then, the laser beam L is propagated through the vertical waveguide 120b so as to arrive at the light-receiving surface 500 efficiently through the lens 13.

Figure 11:
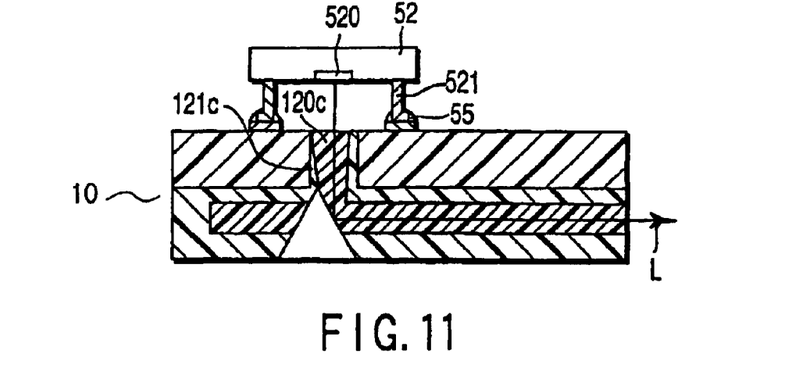
FIG. 11 is a cross sectional view showing a mounted board in which a lead 521 of a light-emitting element 52 is soldered to the optical-electrical wiring board 10 provided with a tapered optical waveguide 121c.

FIG. 11 shows a mounted board, in which a lead 521 of a light-emitting element 52 is soldered to the optical-electrical wiring board 10 provided with a tapered optical waveguide 120.

As shown in FIG. 11, the laser beam L emitted from the light emitting surface 520 of the light-emitting element 52 is propagated through the vertical waveguide 120b and, then, reflected by the mirror 123 so as to be propagated through the horizontal waveguide 120a. It should be noted that the core diameter of the vertical waveguide 120b is gradually diminished from the side of the mounting surface of the electric wiring board 11 toward the mirror 123 as described previously, with the result that the optical axis of the light-emitting surface can be aligned easily with the optical axis of the vertical waveguide 120b.

The particular construction described above makes it possible to obtain prominent effects as described below.

First of all, since the optical wiring layer is mounted on the board having an electric wiring, it is possible to achieve a high density mounting and to achieve miniaturization.

It is also possible to align easily the optical axis of the optical part with the optical axis of the vertical waveguide by forming a lens at one end of the vertical waveguide or by forming the vertical waveguide in a tapered shape. As a result, it is possible to automatically mount simultaneously both the optical part and the electric part.

It should also be noted that the optical wiring layer 12 is mounted on a flat surface of the electric wiring board, i.e., to the surface on which the electric wiring is not formed. Therefore, it is possible for the optical wiring layer 12 to propagate the optical signal with a low attenuation rate without being affected by the irregularity given by, for example, the electric wiring.

It should also be noted that the mirror 123 is formed after the optical wiring layer 12 is bonded to the electric wiring board 11. Also, the mirror 123 is formed with the alignment mark of the electric wiring board used as a reference. It follows that it is possible to realize the mirror formation with a high accuracy.

The optical-electrical wiring board of the present invention is constructed such that the electrical wiring board is laminated on the optical wiring layer 12 and, then, the optical part or the like is mounted on the electric wiring board 11. It follows that it is possible to form all of the electric wiring, the pad, and the connecting means for connecting the electric wiring to the pad on one surface of the electric wiring board 11 so as to simplify the construction of the apparatus and to simplify the manufacturing process of the apparatus.

What should also be noted is that the vertical waveguide 120b and the vertical clad 121b collectively form the optical wiring extending from one surface to the other surface of the electric wiring substrate 11. It follows that the optical signal is propagated through the core 120, i.e., the vertical waveguide 120b, to reach the surface of the electric wiring board 11 and, then, is incident on the optical part. Also, the optical signal is propagated through the core 120 immediately after the optical signal is emitted from the optical part. As a result, it is possible to lower the attenuation rate of the light so as to make it possible to perform an efficient exchange of the optical signal. In addition, each of the vertical waveguide 120b and the vertical clad 121b reflects the external light on the surface at one end, thereby performing the function of removing the noise.

<Second Embodiment>

A second embodiment of the present invention will now be described in detail with reference to FIGS. 8A, 8B and 8C.

2-1: Optical-Electrical Wiring Board

An important point of the optical-electrical wiring board according to a second embodiment of the present invention resides in the technical idea that a board having an electric wiring and having an optical part or an electrical part mounted thereon is laminated on the optical wiring layer having an optical waveguide for propagating the light in a direction along the layer.

FIG. 8C is a cross sectional view showing the optical-electrical wiring board 10 according to the second embodiment of the present invention, which is cut along the core pattern forming the optical wiring. As shown in FIG. 8C, the optical-electrical wiring board 10 is constructed such that the electric wiring board 11 is laminated on an optical wiring layer 62.

Arranged on one surface of the electric wiring board 11 are an electric wiring (not shown), pads 14, 15, 16, 17 (pads 14 and 16 being not shown) for mounting an optical part, and a pad (not shown) for mounting an electric part. The optical wiring layer 62 is bonded to the other surface of the electrical wiring board 11.

The through-hole 30 extending vertically through the electrical wiring board 11 is formed in the board 11. The through-hole 30 is a hole through which passes the light beam. As described herein later, it is possible to exchange the optical information between the optical part mounted on the electrical wiring board 11 and the optical wiring layer 62 via the through-hole 30.

As described previously in conjunction with the first embodiment, it is possible for the electrical wiring board 11 to be an insulating board of a single layer structure or to be a multi-wiring board in which an electric wiring and an insulating layer are alternately laminated one upon the other. Also, it is possible for the electrical wiring board 11 to be formed of an insulating board prepared by impregnating a glass cloth with a resin, to be formed of a polyimide film, or to be formed of a ceramic board. Where the electric wiring formed on the electrical wiring board 11 comprises a plurality of layers, it is possible to arrange an conductor layer serving to electrically connect the adjacent layers of the electric wiring on the inner surface of the through-hole 30.

The optical wiring layer 62 comprises a core 620 acting as an optical wiring for propagating an optical signal and a clad 621 having a refractive index lower than that of the core 620 and having the core 620 buried therein.

Further, the optical wiring layer 62 is connected to one end (lower end in FIG. 8C) of the through-hole 30 extending through the electric wiring board 11 having an electric wiring. The mirror 123 having a surface inclined by 45° relative to the surface of the electric wiring board 11 is arranged in the connecting portion. Incidentally, the other end (upper end in FIG. 8C) of the through-hole 30 is exposed to the surface of the electric wiring board 11.

The mirror 123 is formed by a dicing process having a blade of 90° or by an oblique etching utilizing a dry etching such as RIE. The specific method of forming the mirror will be described herein later. It should be noted that the mirror 123 can be formed on the basis of a reference position having an optical wiring formed therein, with the result that the positional accuracy between the optical wiring and the core is rendered very high.

Incidentally, the mirror 123 is formed in the position where the route of the light beam passing through the through-hole 30 crosses the route of the light beam propagated through the core 620 and acts as a reflecting mirror for reflecting the optical information exchanged between the through-hole 30 and the core 620. It follows that the angle of the mirror 123 is dependent on the angle made between the through-hole 30 and the core 620, and the mirror 123 is formed at an angle suitable for exchanging the optical information between the two. For example, in the optical-electrical wiring board 60 shown in FIG. 8C, the through-hole 30 and the core 620 are formed to make an angle of 90°. It follows that the mirror 123 is formed to make an angle of 45° with each of the through-hole 30 and the core 620.

(Manufacturing Method of Optical-Electrical Wiring Board)

A method of manufacturing the optical-electrical wiring board 60 according to the second embodiment of the present invention will now be described with reference to FIGS. 8A, 8B and 8C.

As shown in FIG. 8A, the through-hole 30 having a diameter of 100 μm is formed by a laser treatment in the electrical wiring board 11 formed of a polyimide substrate having a thickness of 125 μm. As shown in FIG. 8A, an electrical wiring and pads 14, 15, 16, 17 (pads 14 and 16 being not shown) are formed on one surface of the electric wiring board 11.

In the next step, the optical wiring layer 62 is bonded to the back surface (surface opposite to the surface on which are formed the electrical wiring and the pads 15, etc.) of the electrical wiring board 11, as shown in FIG. 8B. The bonding is performed by using, as a reference, an alignment mark (not shown) formed on the bonding surface between the electrical wiring board 11 and the optical wiring layer 12.

Further, as shown in FIG. 8C, the mirror 123 having a surface inclined by 45° from the surface of the electric wiring board 11 is formed in the connecting portion between the core of the optical wiring 62, which is parallel to the surface of the electrical wiring board 11, and the core of the optical through-hole, which is perpendicular to the surface of the electrical wiring board 11. The mirror 123 is formed by a dicing process using a blade of 90° or by an oblique etching of RIE. It is possible for the mirror 123 to be a mirror having a metal reflecting film formed thereon by a sputtering method or a vapor deposition method. Incidentally, the mirror 123 is formed by using as a reference an alignment mark (not shown) formed at the bonding surface between the electrical wiring board 11 and the optical wiring layer 62.

The optical wiring layer 62 is formed in advance as follows. In the first step, one surface of the electrical wiring board 11, which acts as a supporting substrate formed of, for example, a silicon wafer, is coated with a fluorine-containing epoxy resin adjusted to have a refractive index of 1.52, followed by curing the coated resin layer at 200° C. so as to form a part of the clad 621 having a thickness of 20 μm. Then, the cured resin layer is coated with a fluorine-containing epoxy resin adjusted to have a refractive index of 1.53, followed by curing the coated resin layer at 200° C. so as to have a thickness of 8 μm and subsequently applying a dry etching by the ordinary method so as to form the core 620 acting as an optical waveguide. In this step, the core 620 has a width of, for example, 8 μm.

Further, the core 620 is similarly coated with a fluorine-containing epoxy resin adjusted to have a refractive index of 1.52 so as to form the remaining portion of the clad 621. In this step, the remaining portion of the clad 621 has a thickness of, for example, 20 μm as measured from the core 620. Finally, the optical wiring layer 62 is peeled off the supporting substrate so as to obtain the optical wiring layer 62.

Incidentally, as another method of manufacturing the optical-electrical wiring substrate 60 according to the second embodiment of the present invention, it is possible to form successively the optical wiring layer on a polyimide substrate 11. In employing this method, it is necessary to form the optical wiring layer with the through-hole closed temporarily, or to form the through-hole 30 after formation of the optical wiring layer.

(Manufacturing Method of Mounted Board)

A manufacturing method will now be described in respect of a mounted board, in which the optical part, etc. is mounted on the optical-electrical wiring board 60 according to the second embodiment of the present invention.

Figure 12:
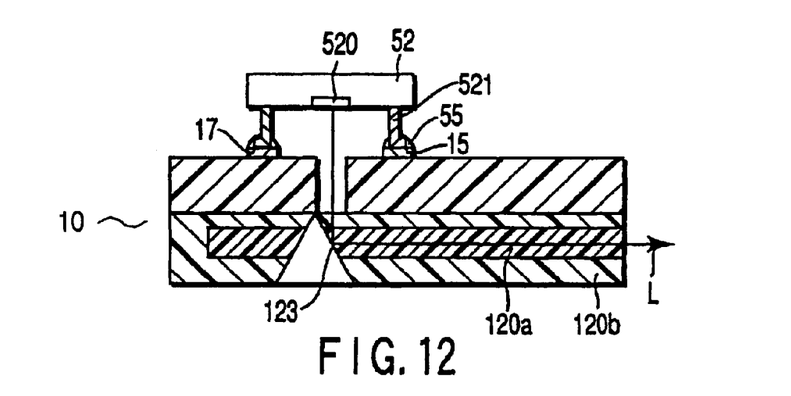
FIG. 12 is a cross sectional view showing a mounted board in which a lead 521 of a light-emitting element 52 is soldered to an optical-electrical wiring board 60.

FIG. 12 shows a mounted board, in which a lead 501 of a light-receiving element 50 is soldered to the optical-electrical wiring board 60. As shown in FIG. 12, the optical part and the electrical part are electrically connected to the optical-electrical wiring board 60 by a solder bonding between the pad and the metal lead of each part, which is performed by a solder 55. Also, where the optical part, etc. does not have a metal lead, the electrical connection is performed by using, for example, a solder ball.

The laser beam L propagated through the optical wiring layer 62 is reflected by the mirror 123. Then, the laser beam L is transmitted through the through-hole 30 so as to arrive at the light-receiving surface 500.

The construction described above permits producing prominent effects as described below. First of all, since it is possible to form the optical wiring layer on that surface of the electrical wiring board on which the electrical wiring is not formed, the optical wiring layer is rendered smooth so as to suppress the attenuation of the optical signal.

It should also be noted that the electrical wiring (or pad) and the optical wiring layer are formed on different surfaces of the electrical wiring board. What should be noted is that, since the optical wiring layer is formed on the lower surface of the electrical wiring board in the mounting step (soldering step) of the optical part and the electrical part to the electrical wiring, the optical wiring layer is less affected thermally.

It should also be noted that the mirror 123 is formed in the present invention after the optical wiring layer 62 is bonded to the electrical wiring board 11. Also, an alignment mark of the electrical wiring board 11 is used as a reference in forming the mirror 123. It follows that it is possible to form the mirror 123 with a high accuracy.

The optical-electrical wiring board of the present invention is constructed such that the electrical wiring board 11 is laminated on the optical wiring layer 62, and the optical part, etc. are mounted on the electrical wiring board 11. It follows that it is possible to mount all of the electrical wiring, the pads, and the connecting means for connecting the electrical wiring to the pads on one surface of the electrical wiring board 11 so as to make it possible to simplify the apparatus and to simplify the manufacture of the apparatus.

The optical-electrical wiring board 60 according to the second embodiment of the present invention is constructed such that the optical signal is passed from one surface to the other surface of the electrical wiring board 11 via the through-hole 30. It follows that it is possible to simplify the construction of the apparatus and to simplify the manufacture of the apparatus, compared with the case where the optical wiring including the core and the clad is formed inside the through-hole 30.

The present invention is not limited to the embodiments described above. It is of no difficulty for those skilled in the art to arrive at various modifications and alterations within the technical scope of the present invention. Needless to say, it is reasonable to understand that these modifications and alterations belong to the technical scope of the present invention. For example, the present invention can be modified in various fashions within the technical scope of the present invention as exemplified in items (1) and (2) given below.

(1) In FIGS. 5 and 11, the tapered vertical waveguide 120b is formed to extend from that surface of the electrical wiring board on which the optical part is mounted onward the mirror 123. The particular construction assumes that the light-emitting element 52 is mounted on the optical-electrical wiring board.

On the other hand, where the light-receiving element 50 is mounted on the optical-electrical wiring board 10, it is conceivable to employ the optical-electrical wiring board 10 including the tapered vertical waveguide 120b formed to extend from that side of the electrical wiring board on which the optical wiring layer 12 is bonded toward the mounting surface of the optical part. In this case, it suffices to irradiate the tapered vertical waveguide 120b with a laser beam from the side of the optical wiring layer 12 in the step shown in, for example, FIG. 6F.

Figure 13:
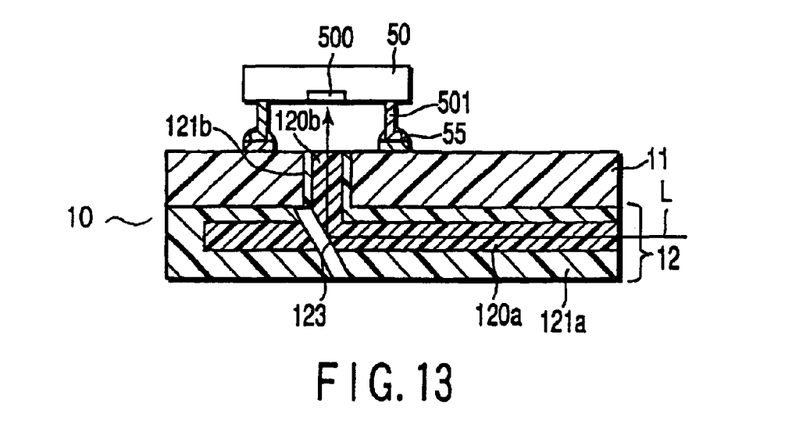
FIG. 13 is a cross sectional view showing a modification of the optical-electrical wiring board 10.

(2) The mirror formed in the optical wiring layer is for suitably receiving and reflecting the light beam and, thus, it is important to pay attention to the angle and the forming position of the mirror. Therefore, the mirror formed in the optical wiring layer need not be limited to the shape of the mirror 123 included in each of the embodiments described above, as far as the mirror produces the particular function described above. For example, it is possible to employ the mirror 123 shown in FIG. 13.

As described above, the present invention provides an optical-electrical wiring board and a mounted board that permit a high density mounting or miniaturization and also permit propagating the optical signal with a high efficiency, and a method of manufacturing the particular optical-electrical wiring board and the mounted board.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical-electrical wiring board, comprising:

an electrical wiring board having a through-hole formed therein;

an optical wiring layer laminated on said electrical wiring board and including a core through which the light is propagated and a clad surrounding said core; and a mirror;

said electrical wiring board including an electrical wiring formed on a first surface and mounting unit configured to mount an optical part and to be electrically connected to said electric wiring and mounted in the vicinity of said through-hole of said first surface;

said core including a first waveguide to propagate the light in a first direction along said electrical wiring board and a second waveguide to propagate the light in a second direction perpendicular to said electrical wiring board, said second waveguide crossing the first waveguide and a part of said second waveguide being arranged within said through-hole; and said mirror arranged in the crossing point between said first waveguide and said second waveguide and serving to reflect the light propagated through one waveguide toward the other waveguide.

2. The optical-electrical wiring board according to claim 1, wherein one end of said second waveguide is exposed to said first surface.

3. The optical-electrical wiring board according to claim 1, wherein said optical-electrical wiring board further comprises a light-collecting lens mounted on said first surface.

4. The optical-electrical wiring board according to claim 1, wherein said second waveguide is tapered from said first surface toward a second surface opposite to said first surface or from said second surface toward said first surface.

5. The optical-electrical wiring board according to claim 1, wherein:

said electrical wiring comprises a plurality of layers, and connecting means for electrically connecting said plural layers of said electrical wiring is arranged inside said through-hole.

6. The optical-electrical wiring board according to claim 1, wherein said mounting unit is arranged such that, when a light-emitting element or a light-receiving element is mounted on said mounting unit, the light-emitting surface of said light-emitting element or the light-receiving surface of said light-receiving element is arranged on the axis of said second waveguide.

7. A mounted board prepared by mounting an electric part to the optical-electrical wiring board according to claim 1.

* * * * *